United States Patent [19]

Tsuchiya

[11] Patent Number: 5,155,562
[45] Date of Patent: Oct. 13, 1992

[54] SEMICONDUCTOR DEVICE EQUIPPED WITH A CONDUCTIVITY MODULATION MISFET

[75] Inventor: Kazuhiro Tsuchiya, Matsumoto, Japan

[73] Assignee: Fuji Electric Co., Ltd., Japan

[21] Appl. No.: 654,882

[22] Filed: Feb. 13, 1991

[30] Foreign Application Priority Data

Feb. 14, 1990 [JP] Japan .................. 2-33267
Aug. 31, 1990 [JP] Japan .................. 2-232236
Oct. 24, 1990 [JP] Japan .................. 2-286490

[51] Int. Cl.⁵ .............................. H01L 29/78
[52] U.S. Cl. ...................... 357/23.4; 357/38; 357/41; 357/51
[58] Field of Search ............ 357/23.4, 38, 41, 51

[56] References Cited

U.S. PATENT DOCUMENTS

| | | | |
|---|---|---|---|
| 4,626,879 | 12/1986 | Colak | 357/23.4 |
| 4,761,679 | 8/1988 | Stupp | 357/23.4 |
| 4,782,372 | 11/1988 | Nakagawa et al. | 357/23.4 |
| 4,901,131 | 2/1990 | Takahashi | 357/23.4 |
| 4,912,541 | 3/1990 | Baliga et al. | 357/23.4 |
| 4,939,566 | 7/1990 | Singer et al. | 357/23.4 |
| 4,980,743 | 12/1990 | Nakagawa et al. | 357/23.4 |
| 4,989,058 | 1/1991 | Colak et al. | 357/51 |
| 5,023,678 | 6/1991 | Kinzer | 357/23.4 |

FOREIGN PATENT DOCUMENTS

| | | | |
|---|---|---|---|
| 63-80569 | 4/1988 | Japan | 357/23.4 |
| 1-238062 | 9/1989 | Japan | 357/23.4 |
| 2-138774 | 5/1990 | Japan | 357/23.4 |

Primary Examiner—Rolf Hille
Assistant Examiner—Steven Loke
Attorney, Agent, or Firm—Brumbaugh, Graves, Donohue & Raymond

[57] ABSTRACT

A semiconductor device including a conductivity modulating MISFET comprising a conductvitiy modulation layer of a first conductive type, a base region of a second conductive type, a source region of the second conductive type in the base region, a gate electrode on an insulating layer on the base region, an injection region of the second conductive type, and a drain electrode coupled to the injection region and the conductivity modulation layer. Wherein, the semiconductor device has a one-side electrode structure and the drain electrode coupled to the conductivity modulation layer provides a resistance parallel to a parasitic diode between the injection region and the conductivity modulation layer sufficient to forward bias the parasitic diode.

5 Claims, 5 Drawing Sheets

SEMICONDUCTOR DEVICE EQUIPPED WITH A CONDUCTIVITY MODULATION MISFET

FIELD OF THE INVENTION

The present invention relates to a semiconductor device equipped with a conductivity modulation MISFET, and more particularly to the structure of a drain electrode in a conductivity modulation MISFET that can be formed in an integrated circuit.

BACKGROUND OF THE INVENTION

Figure 10:
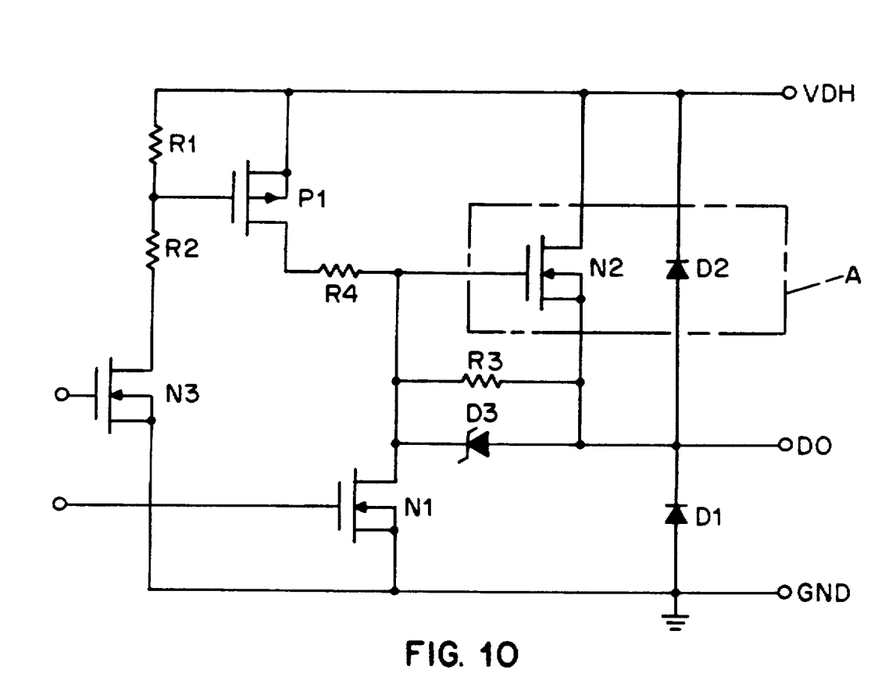
FIG. 10 is a circuit diagram illustrating the use of a double diffusion MOSFET in a display driver output circuit.

In the output circuit of display drive integrated circuits shown in FIG. 10, it has conventionally been advantageous to use the parasitic diode existing in a double diffusion MOSFET as diode D2, which is connected in parallel to an FET, if a double diffusion MOSFET (DMOS) is used as transistor N2 in the A region of this output circuit.

Figure 11:
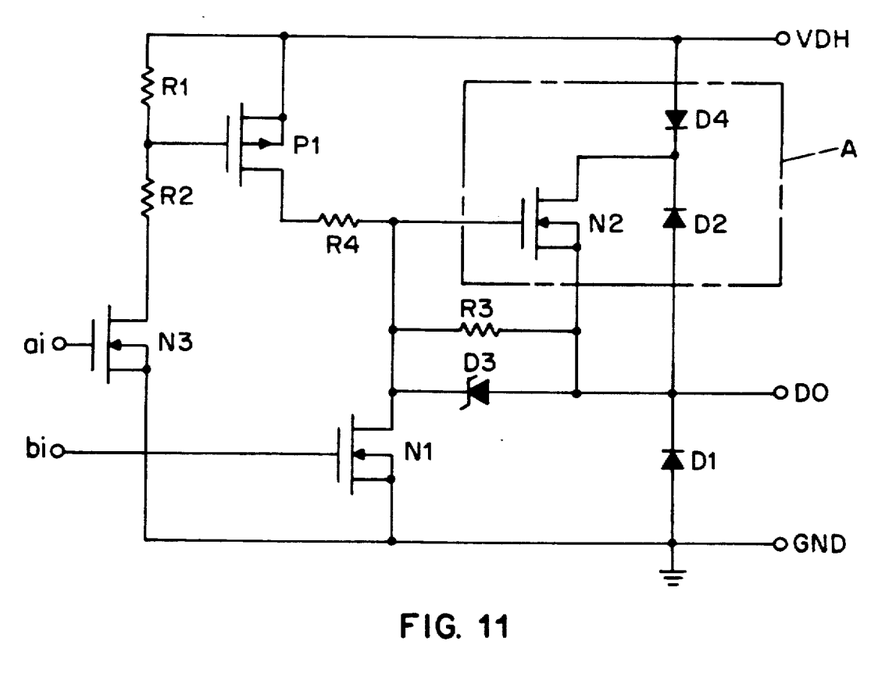
FIG. 11 is a circuit diagram illustrating the use of a conductivity modulation MOSFET in a display driver output circuit.
Figure 12:
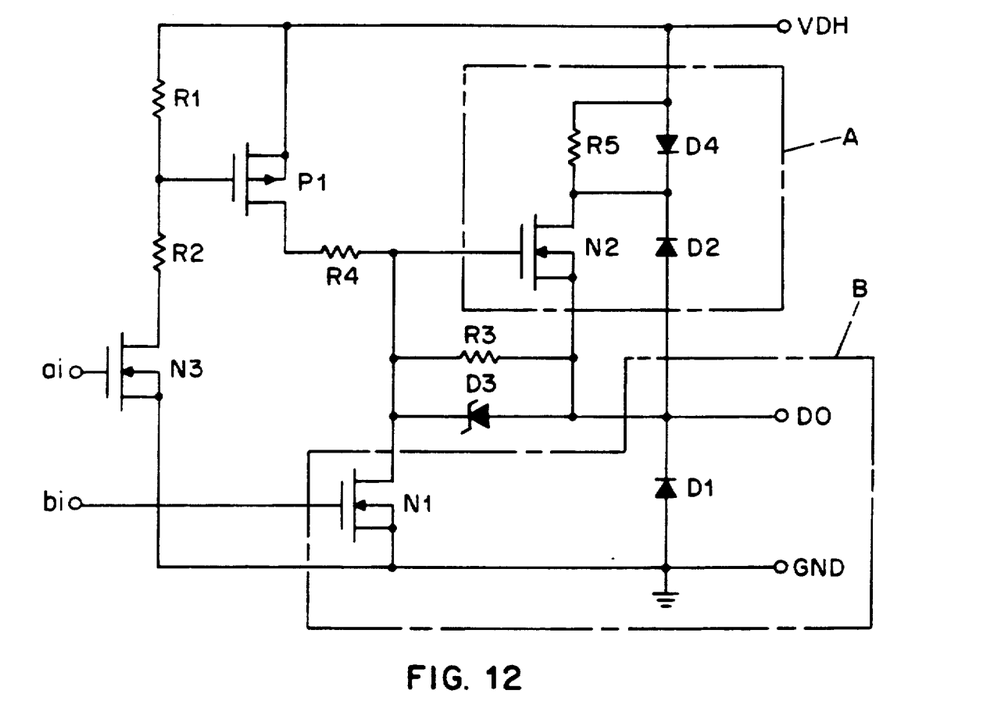
FIG. 12 is a circuit diagram illustrating the use of a conductivity modulation MOSFET of the anode short type in a display driver output circuit.
Figure 13:
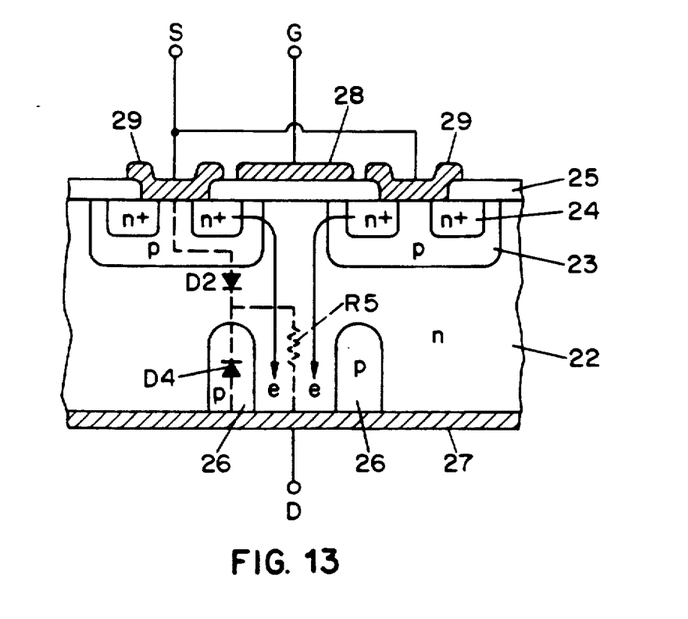
FIG. 13 is a cross section illustrating the structure of a conventional conductivity modulation MOSFET of the anode short type.

However, if an attempt is made to use a conductivity modulation MOSFET (IGBT) as transistor N2, diode D2 becomes inoperative because of the existence of a parasitic diode D4 serially connected to transistor N2 in addition to parasitic diode D2, as shown in FIG. 11. To make D2 operative, a parallel resistance R5 can be connected in parallel with diode D4 as shown in FIG. 12. A conductivity modulation MOSFET of anode short type that contains said type of circuitry is shown in FIG. 13.

In this conductivity modulation MOSFET, a p-type base region (23) and an n-type source region (24) are formed on the front surface of n-type conductivity modulation layer (22) by means of a double diffusion process, with an insulation layer (25), a gate electrode (28), and a source electrode (29) being disposed thereon. A minority carrier injection region (26) is formed by means of a diffusion process on the rear surface of the conductivity modulation layer (22). This rear surface is entirely covered by a drain electrode (27). In this case, the drain electrode (27) is structured so as to be in direct contact with the conductivity modulation layer (22), other than the minority carrier region (26), in order to shorten the time needed for the conductivity modulation MOSFET to transit to a low state of conductivity. Thus, a parallel circuit having parallel resistance R5 is formed. Parts D2 and D4, shown by dotted lines in FIG. 13, are parasitic diodes.

In this conductivity modulation MOSFET, when positive potential is applied to the gate electrode (28), electrons flow from the source region (24) to the conductivity modulation layer (22) via an inversion layer, resulting in holes to flow from the minority carrier injection region (26) into the conductivity modulation layer (22) as a result of the forward potential difference generated from a voltage drop in parallel resistance R5. This raises the conductivity of the conductivity modulation layer (22), and thus allows a large current to flow. Removal of the positive potential in the gate electrode (28) causes the inversion layer to disappear, the electrons to stop flowing in, the carrier to discharge, and the conductivity modulation layer (22) to become high in resistance again.

The circuit in region B of the circuit in FIG. 12 is called an "open-drain structure", and the circuit in region B can also be structured by a conductivity modulation MISFET of anode short type. If a conductivity modulation MISFET is used in a circuit of this type, a bonding pad or bump electrode is formed as an external connecting electrode at terminal DO in the figure, a multi-output drive circuit can be made that contains a large number of open-drain circuits (80 circuits, for example), and an equal number of DO terminals. Furthermore, each of the DO terminals is connected with a bonding pad or bump electrode.

In the above conductivity modulation MISFET of anode short type, conductivity modulation may become impossible if the value for parallel resistance R5 is too small. On the other hand, the effect of parallel resistance R5 cannot be obtained if the value for parallel resistance R5 is too large. Therefore, the resistance value of this parallel resistance R5 must be set at an adequate value and can be adjusted by changing the depth of the minority carrier injection region (26). However, if a diffusion process is used, diffusion to a great depth may reduce the accuracy of the shape of the diffusion region, thus making it difficult to obtain an accurate resistance value for controlling the minority carrier injection region (26) in the depth direction.

In addition, when this conductivity modulation MISFET of anode short type is incorporated in an integrated circuit, the element current is generally reduced, as is the voltage drop of parallel resistance R5. Therefore, to ensure an operation that will induce a conductivity modulation by applying a forward bias voltage ($\sim 0.7$ V) between the minority carrier injection layer and the conductivity modulation layer, the value of parallel resistance R5 must be increased. However, increasing the resistance value is difficult because the setting range of the resistance value is restricted by the resistance factor of the conductivity modulation layer (22) and the element size. Thus separate resistance layers were heretofore required.

Furthermore, the existence of the drain electrode on the rear surface made it difficult to form an integrated circuit. It also became difficult to make the element separation technology and made the wiring arrangement more complex.

Moreover, connecting the drain electrode to a junction pad or bump electrodes on a large number of DO terminals causes many wirings to cross the elements. The wiring potential affects the elements, possibly causing a reduction in the breakdown voltage. In addition, the inability to form elements beneath the bonding pad or bump electrodes, in order to improve reliability, prevented a higher integration of the circuit.

SUMMARY OF THE INVENTION

It is an object of the present invention to solve the above problems by producing a conductivity modulation MISFET in which a parallel resistance can be efficiently formed in a small installation area without requiring additional manufacturing processes, and which can be incorporated into an integrated circuit by forming a drain electrode on the front surface of the conductivity modulation layer, as well as by using the characteristics of the drain electrode junction face, or by defining the relations among the regional structures.

More specifically, to solve the above problems, the present invention provides a semiconductor device equipped with a conductivity modulation MISFET, comprising an MIS part containing a second conductive region and a first conductive region formed, e.g., by a double diffusion process on the outer surface of a first conductive conductivity modulation layer, and a second conductive minority carrier injection region formed in an insulation region opposite to said MIS part on the outer surface of said conductivity modulation layer. Said semiconductor device has a drain electrode that conductively contacts said minority carrier injection region on the outer surface of said conductivity modulation layer, with said drain electrode having an electrode junction face of a predetermined area that contacts said conductivity modulation layer. Means taken by the present invention includes disposing a drain electrode in contact with a minority carrier injection region on the front surface of a conductivity modulation layer, with the drain electrode forming an electrode junction face of a predetermined area conductively contacting the conductivity modulation layer. This drain electrode may be integrated with an external fetch electrode.

The electrode junction face may be farther isolated from the MIS part than from said minority injection region. In this case, the electrode junction face may be formed in a region other than the lower layer of the conductivity modulation layer beneath the electrode junction face.

In the above means, the minority carrier injection region may be formed so as to surround the region beneath the electrode junction face in the conductivity modulation layer.

Beneath this electrode junction face, a first contact region conductively contacting the conducivity modulation layer may be formed later. In this case, the minority carrier injection region may be formed such that it is subsumed by said contact region, or such that it surrounds said contact region on the surface of the conductivity modulation layer, or may be arranged such that it sandwiches the contact region by the minority carrier injection regions and juxtaposes the contact region and the minority carrier injection regions on both sides opposite to the MIS part. The edge of the contact region on the side of the MIS part may be formed at a deep position that is isolated farther from said MIS part than from the edge of said minority injection region opposite the MIS part. Furthermore, in each of the above means, a conductivity modulation layer may be formed on a second conductive layer, such as a second conductive semiconductor substrate, an embedded layer, and so become a conductive layer formed in a higher carrier concentration.

According to the first means described above, because the drain electrode conductively contacts the minority carrier injection region as well as the conductivity modulation layer at the electrode junction face of a predetermined area, the contact resistance at this electrode junction face forms a resistance connected in parallel with parasitic diodes existing at the junction of the minority carrier injection region and the conductivity modulation layer. This parallel resistance is set at a predetermined value by means of adjusting the area of the electrode junction face while taking the contact resistance value into account. Therefore, this arrangement requires neither a separate resistance layer nor any additional manufacturing processes, and it reduces the installation space. In addition, because the drain electrode and minority carrier injection region are formed on the front surface of the conductivity modulation layer, the manufacturing process is simplified, thus reducing the number of production processes, facilitating the wiring arrangement and element separation, and making the structure suitable for formation in an integrated circuit.

Integrating the drain electrode and an external fetch electrode will eliminate the need for wiring between the drain electrode and the external fetch electrode, remove the problem of a drop in the breakdown voltage of the elements under wiring, and offer a possibility of integrating the circuits. In this case, because the area of the external fetch electrode is sufficiently larger than the element, the contact part of the drain electrode with the minority carrier region can be formed on the side of the MIS part. On the other hand, the electrode junction face can be isolated further from said MIS part than from this contact part. In this case, when current flows from the MIS part through the conductivity modulation layer, a parasitic resistance exists in parallel with the parasitic diodes between the minority carrier region and the conductivity modulation layer because the electrode junction face is farther isolated from the minority carrier region. In this case, resistance of the conductivity modulation layer itself can be applied to the contact resistance of the electrode junction face without causing an increase in the installation area of the elements, thus facilitating the setting of the parallel resistance. If a structure is selected in which a region beneath the electrode junction face of the conductivity modulation layer is surrounded by the minority carrier injection region, the cross-section of the region beneath the electrode junction face is limited by the minority carrier injection region, hence generating a pinch resistance corresponding to the cross-section and length of the region. This allows the pinch resistance value to be changed by changing the shape of the minority carrier injection region, thus making possible the optimization of the parallel resistance value. If the electrode junction of the drain electrode and the conductivity modulation layer is connected via the first conductive contact region, formation can be made with good ohmic character between the drain electrode and the contact region by controlling the concentration of impurities in the contact region, and the formation of a Schottky junction on the electrode junction face is prevented. In addition, the parallel resistance value can be optimized by changing the concentration of impurities in the contact region, its shape, or the ratio of the area of the contact region and the minority carrier region that contact the drain electrode.

If a minority carrier injection region is formed in a contact region, the contact region can function as a stopper for a depletion layer formed in the conductivity modulation layer as a result of a junction with the base region. When forming a flat pattern in which the minority carrier injection regions surrounds the contact region on the front surface of the conductivity modulation layer, the resistance value of said parallel resistance can be changed to a wider range based on the relation between the depth of the contact region and that of the minority carrier injection region. In addition, if the contact region is sandwiched between the minority carrier injection regions, and the contact region and the minority carrier injection regions on both their sides are juxtaposed opposite to the MIS part, and the edge of the contact region on the side of MIS part is formed at a deep opposition isolated farther from the said MIS part than from the edge of said minority injection region on the side of the MIS part, then the contact region can be connected to a narrow band of the conductivity modulation layer sandwiched by the minority carrier injection regions that are situated in a direction toward the MIS part, whereas a pinch resistance is generated that corresponds to the width and length of this narrow band. In this case, because the width and length of the narrow band are formed with high accuracy only from a mask shape formed by diffusion, the resistance value of the parallel resistance can be controlled easily and more precisely.

If a conductivity modulation layer is formed on the second conductive layer, applying a source potential to this second conductive layer will cause the drain voltage to rise, and a depletion layer to expand from an interface of the second conductive layer and the conductivity modulation layer to the inside of the conductivity modulation layer. In this case, the depletion layer will meet with the depletion layer expanding from an interface of the base region and the conductivity modulation layer, and thereafter, the depletion layer in the second conductive layer will expand. Hence, the depletion electric field will be alleviated in the base region, making it more difficult for a punch-through to occur, and making it possible to obtain high breakdown voltage elements. In this case, if the second conductive layer is formed so as to make its carrier concentration high, its resistance factor will be decreased, whereby the current will flow either out or in an on state even if it flows through the second conductive layer, thus allowing an increase in the current carrying capacity of the elements.

DETAILED DESCRIPTION OF THE PREFERRED EMBODIMENTS

Figure 1:
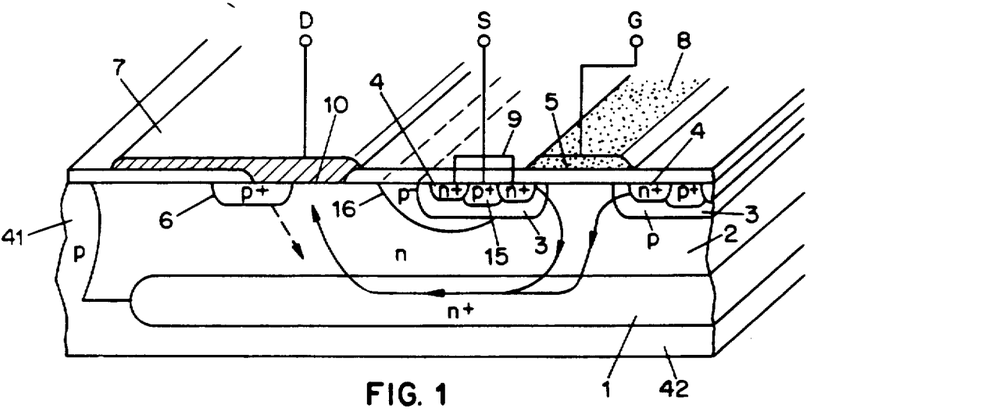
FIG. 1 is a longitudinal sectional drawing illustrating a conductivity modulation MISFET according to a first embodiment of the present invention.

In the first embodiment of the present invention, an n-type embedded layer (1) is formed on the bottom surface of an island-shaped region p-n junction and is separated by a p-type isolation region (41) on a p-type substrate (42). Also, an n-type conductivity modulation layer (2) is formed on the embedded layer (1), and a p-type base region (3) and an n-type source region (4) are formed on the front surface of the conductivity modulation layer (2) through a diffusion process. These are covered by an insulation layer (5), on which a polysilicon gate electrode (8) is disposed to construct the MIS parts that use the source region (4) as their source, the conductivity modulation layer (2) as their drain, and the surface part of the base region (3) disposed directly below the gate electrode (8) via the insulation layer (5) as their channel region. Furthermore, a p-type source contact region (15) is formed in the base region (3), the source contact region (15) and the source region (4) conductively contacting the source electrode (9) (not shown except for the connection).

A $p^+$-type minority carrier injection region (6) is diffusively formed on the front surface of the conductivity modulation layer (2) and located away from its MIS part. A drain electrode (7), conductively contacting the minority carrier injection region (6), is also in direct contact with junction face (10). Furthermore, on the side of the minority carrier injection region (6) in the base region (3), a $p^-$-type graft base (16) is disposed to prevent any electric field concentrations. The drain electrode (7) is formed integrally with the bonding pad that is an external fetch electrode. The drain electrode (7) is connected to drain D, the source electrode (9) is connected to source S, and the gate electrode (8) is connected to gate G.

Figure 9:
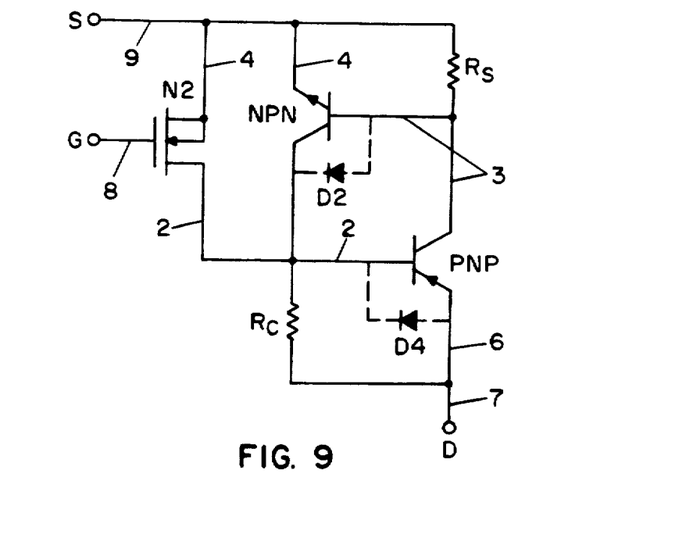
FIG. 9 is an equivalent circuit diagram of a conductivity modulation MISFET according to an embodiment MISFET of the present invention.

In this conductivity modulation MISFET, when a positive potential is applied to gate G, with a bias voltage (hereinafter called the drain voltage) applied across drain D and source S, electrons flow from the source region (4) into the conductivity modulation layer (2) through the inversion layer formed on front surface of the base region (3), resulting in the injection of holes from the minority carrier injection region (6) into the conductivity modulation layer (2). The solid lines in FIG. 1 represent the electron path, while the dotted lines represent the hole path. These carriers flow in to induce a high conductivity state in the conductivity modulation layer (2), and cause a large current to flow between the drain D and source S. The activity realizing a transition to this high conductivity state is caused by a voltage drop based on the parallel resistance Rc, as shown in FIG. 9. FIG. 9 shows a circuit similar to this embodiment. In the figure, part Rs is a short circuit resistance parasitically existing between the base region (3) and the source region (4), N2 is a MOSFET, and D2 and D4 are parasitic diodes. In this embodiment, the parallel resistance Rc is secured by a contact resistance at the electrode junction section (10), while a voltage drop in the parallel resistance Rc caused by an electron current flowing through N2 generates a forward bias voltage between the conductivity modulation layer (2) and the minority carrier injection region (6). This, in turn, causes the holes to be injected from the minority carrier injection region (6) to the conductivity modulation layer (2), and a transition to a high conductivity state. At the same time, the wiring section possessing this parallel resistance Rc enables the parasitic diode D2, connected in parallel with the MOSFET N2, to operate.

This embodiment, in which the minority carrier injection region (6) can be formed simultaneously when forming the MIS part, or, for example, when diffusing the source contact the conductivity modulation layer, offers an advantage during the manufacturing process, facilitates the wiring arrangement, and is suitable for being formed into an integrated circuit. In addition, the drain electrode structure is very simple, and the increase of the element installation area can be minimized. Using contact resistance to obtain the parallel resistance Rc of the drain electrode requires no additional manufacturing process during formation. In addition, changing the area of the electrode junction section (10) enables a formation which adjusts the value of the parallel resistance Rc to some extent.

If the electrode junction face (10) is so structured that it surrounds the minority carrier injection region (6) while the cross section of a region in the conductivity modulation layer (2) located beneath the electrode junction face (10) is limited by the minority carrier injection region (6), a pinch resistance created in this region will be added to the contact resistance to form the parallel resistance Rc. Because changing the depth of the minority carrier injection region (6) enables its length to be changed, the pinch resistance value can also be changed, making it possible to change the value of the parallel resistance Rc over a wider range.

The drain electrode (7) formed integrally with the bonding pad as an external fetch electrode eliminates the need to connect wiring between the drain and the external fetch electrode, thereby preventing a breakdown voltage drop resulting from the wiring potential at the element section formed beneath the wiring, and eliminating the need for the space required by the wiring region. Moreover, the region beneath the bonding pad, which has not been used conventionally, can be used effectively because the bonding pad is used for the drain electrode (7), and the space occupied by the elements can be reduced further. In this embodiment, the drain electrode (7) can also be formed as underground wiring for the bump electrode. Furthermore, it is also possible to form it as a single drain electrode similar to the conventional type, and to connect it to other components by wiring.

While this conductivity modulation layer MISFET has an embedded layer (1) beneath the conductivity modulation layer (2) to assure the current carrying capacity, the layer (1) may not be formed to improve the breakdown voltage.

Figure 2:
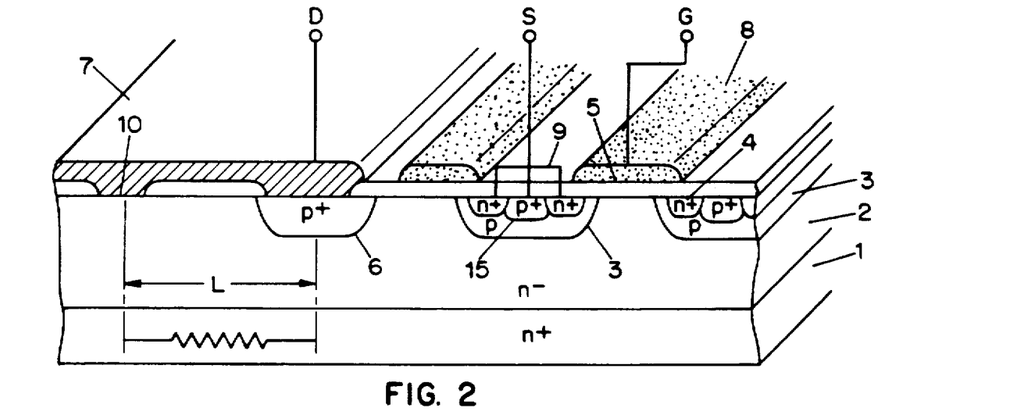
FIG. 2 is a longitudinal sectional drawing illustrating a conducivity modulation MISFET according to a MISFET second embodiment of the present invention.

FIG. 2 shows a second embodiment of the conductivity modulation MISFET according to the present invention. In this embodiment, those parts identical to the first embodiment have the same numerals, and the explanation thereof is omitted. While the minority carrier region (6) and the electrode junction face (10), which are identical to those in the first embodiments, are integrally formed on the drain electrode (7) with the bonding pad in this embodiment, on the MIS part side, while the electrode junction face (10) is formed in a region far from the MIS part. This means that the drain electrode (7) has a parasitic resistance corresponding to the distance L connected in the embedded layer (1) in parallel with the parasitic p-n junction conductivity modulation layer (2). Therefore, the value of the parallel resistance can be set not only by the contact resistance at the electrode junction face (10), but also by the distance L between electrode junction face (10) and the minority carrier region (6). Thus, in this embodiment the parallel resistance is secured by the distance between the electrode contact face and the minority carrier region. However, because the drain electrode (7), which is integrated with the bonding pad, is formed originally with a sufficient size compared with the size of the elements, it is not necessary to increase the size of the drain electrode (7).

Figure 3:
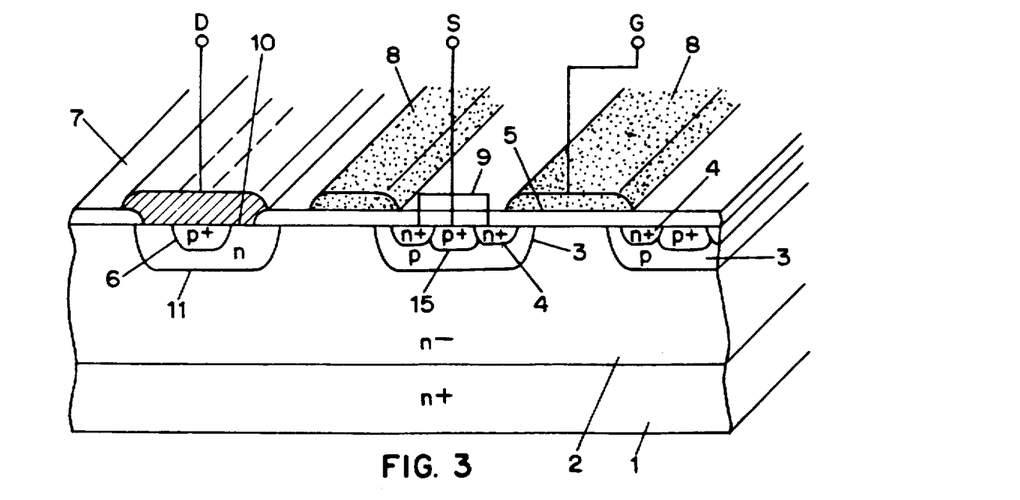
FIG. 3 is a longitudinal sectional drawing illustrating a conductivity modulation MISFET according to a third embodiment of the present invention.

In the first and second embodiments, if the impurity concentration of the conductivity modulation layer (2) is low, the electrode junction face (10) may form a Schottky junction, allowing for the possibility that the parasitic diode D2, as shown in FIG. 9, will become inoperative. Therefore, in the third embodiment, shown in FIG. 3, a contact region (11) is formed on the front surface of the conductivity modulation layer (2), and the drain electrode (7) is conductively connected with the contact region (11). In FIG. 3, the parts identical to those in the first embodiment are provided with the same numerals and their explanation is omitted. The minority carrier injection region (6) is embedded in the contact region (11), and the drain electrode (7) is connected to the minority carrier region (6) at its center, with its periphery also connected to the contact region (11). The graft base (16) described in the first embodiment is not formed.

This embodiment limits the impurity concentration of the contact region (11) to $10^{18}$ cm$^{-3}$ or higher, allowing the attainment of reliable ohmic contact with the drain electrode (7). Therefore, the impurity concentration in the conductivity modulation layer (2) can be set optionally without the need to consider the possibility of the formation of a rectifier junction. The contact region (11) subsuming the minority carrier region (6) prevents a punch-through between the base region (3) and the minority carrier region (6), allowing for a rise in the breakdown voltage. In other words, the contact region (11) also serves as a stopper to prevent the expansion of a depletion layer formed in the conductivity modulation layer (2) by the junction of the conductivity modulation layer (2) with the base region (3). If the drain electrode (7) is disposed in the vicinity of a p-type separation band for p-n junction and separation, its function as a depletion layer stopper will have the effect of preventing a punch-through between this p-type separation band and the minority carrier region (6).

The value of the parallel resistance Rc can be changed, other than by resorting to changing the area of the electrode junction (10), by changing the impurity concentration in the contact region (11) to within a range that does not impair the ohmic junction with the drain electrode (7), and by changing the shape of the contact region (11).

Figure 4:
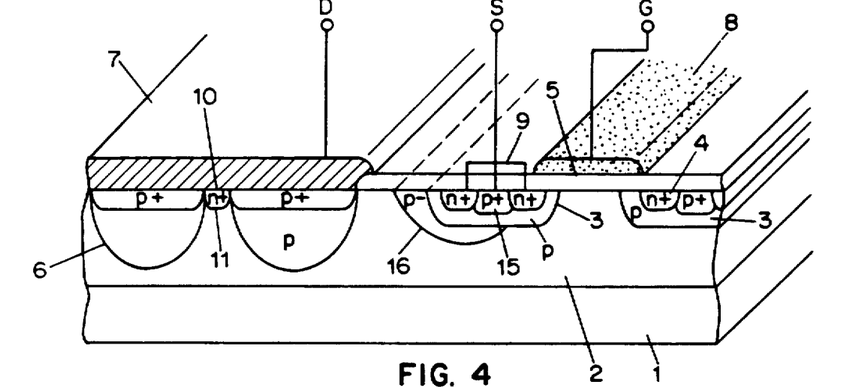
FIG. 4 is a longitudinal sectional drawing illustrating a conductivity modulation MISFET according to a forth embodiment of the present invention.

Next, a fourth embodiment of the present invention is explained with reference to FIG. 4. This embodiment has the same structure as the first embodiment, except for the shape of the contact region (11) and the minority carrier injection layer (6). The identical parts are given the same numerals, and their explanation is omitted.

The minority carrier injection layer (6) surrounds the contact region (11) on the front surface of the conductivity modulation layer (2), and the parallel resistance Rc can be varied by changing the ratio of the contact area of the drain electrode (7) with the minority carrier injection region (6) to the area of the electrode junction face (10). Moreover, if the depth of the minority carrier injection region (6) is increased so that it is greater than the contact region (11), a parasitic pinch resistance beneath the contract region (11) will be formed. In this case, therefore, it is possible to make the depth of the minority carrier injection region (6) shallower than that of the contact region (11) and thereby reduce the resistance value. Therefore, it is possible to change the value of the parallel resistance Rc reliably over a wider range.

Also in this embodiment, the drain electrode (7) is formed integrally on the bonding pad, thereby a sufficient surface area can be assumed for impurity diffusion, thereby deepening the minority carrier injection region (6) and increasing the pinch resistance value.

Figure 5:
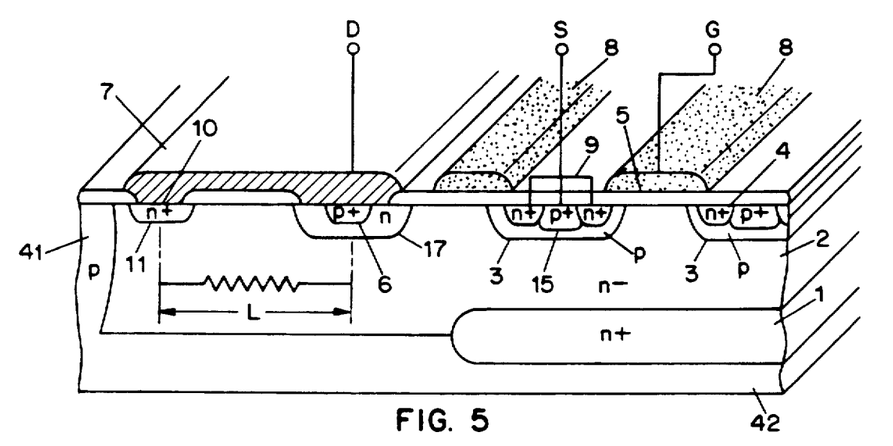
FIG. 5 is a longitudinal sectional drawing illustrating a conductivity modulation MISFET according to a fifth embodiment of the present invention.

Next, a fifth embodiment of the present invention is explained with reference to FIG. 5. In this embodiment, the contact region (11) is also formed beneath the electrode junction face (10), thus making it possible to prevent the formation of a Schottky junction when the impurity concentration in the conductivity modulation layer (2) is low.

In addition, the electrode junction face (10) in the drain electrode (7) is formed in a region further from the MIS part than from the minority carrier injection region (6), as in the case of the second embodiment. However, unlike the second embodiment, the embedded layer (1) is not formed beneath the electrode junction face (10). For this reason, in this embodiment, a parasitic resistance exists corresponding to the distance L in the figure of the conductivity modulation layer (2). Since the conductivity modulation layer (2) has a high resistance because this parasitic resistance becomes part of the parallel resistance Rc, it is very easy to obtain a high resistance. In addition, because the drop in the parasitic resistance value is compensated by an increase in the current amount even if the conductivity modulation MISFET transfers to an on-state, giving the conductivity modulation layer (2) low resistance, it is possible to assure sufficient resistance for the transition to the on-state condition and its maintenance also from the parasitic resistance in the conductivity modulation layer (2).

The embedded layer (1) is formed only beneath the MIS part, and is not formed beneath the electrode junction face (10), nor is it formed beneath the minority carrier injection region (6). As a result, a punch-through may be generated between the minority carrier injection region (6) and the substrate, causing the breakdown voltage in the elements to be decreased. To prevent this, an n-type buffer layer (17) is formed in such a way that it will subsume the surrounding area of the minority carrier injection region (6).

Unlike this embodiment, if the embedded layer (1) is formed and extended to beneath the minority carrier injection region (6), the same parasitic resistance as in the above case may be obtained, and the buffer layer (17) will no longer be necessary.

Figure 6:
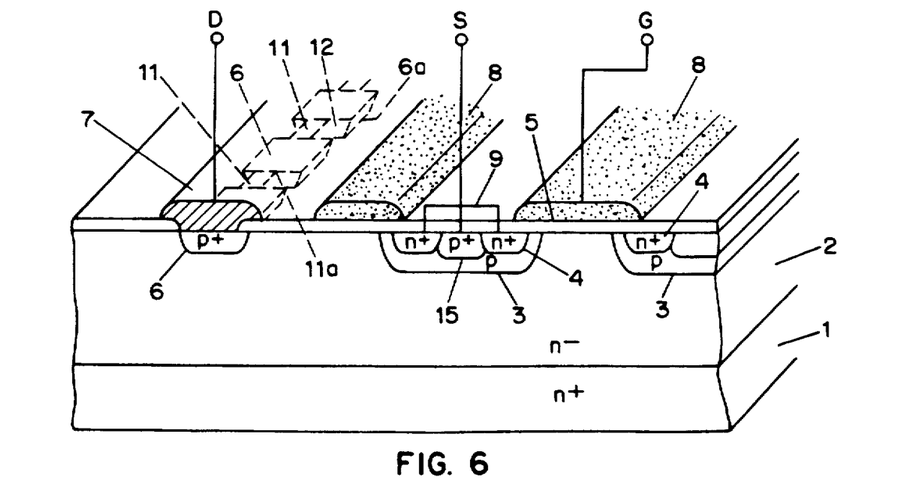
FIG. 6 is a longitudinal sectional drawing illustrating a conductivity modulation MISFET according to a sixth embodiment of the present invention.

FIG. 6 shows a sixth embodiment of the present invention, which is identical with the second embodiment except for the structure around the drain electrode. The identical parts are given the same numerals, and their explanation is omitted. In this embodiment, the surfaces of the minority carrier region (6) and the contact region (11) are both rectangular in shape. They are juxtaposed alternately in parallel in the direction along which the MIS part extends, and the contact region (11) is formed sandwiched by the minority carrier injection region (6) with a narrower width. The edge (11a) of the contact region (11) on the MIS part side is located deeper than the edge (6a) of the minority carrier injection region (6) on the MIS part side. Therefore, the region of the conductivity modulation layer (2) at which the edge (11a) of the contact region (11) makes contact forms a narrow band (12) sandwiched within the minority carrier injection region (6). The narrow band (12) generates a pinch resistance in the direction toward the MIS part. In this case, because both the length and width of the narrow band (12) are determined by the surface shape of both the minority carrier injection region (6) and the contact region (11), it is possible to accurately obtain the pinch resistance value, which is determined approximately according to the length and width. In this way, it is possible to set the parallel resistance Rc accurately.

When the minority carrier injection region (6) and the contact region (11) are formed by the diffusion process, the size of the mask used in the diffusion process can set the length and width of the narrow band (12), and can precisely control the pinch resistance, hence improving the reproducibility and uniformity of the value in the parallel resistance. It is possible as a matter of course to control the value of the parallel resistance Rc by changing the area, depth and width of the minority carrier injection region (6) and the contact region (11).

In this embodiment, a narrow band is also formed on the opposite side of the MIS part. Therefore, the minority carrier injection region (6) is sectioned into various parts, but only the structure forming the narrow band on the MIS part side may be adopted.

Figure 7:
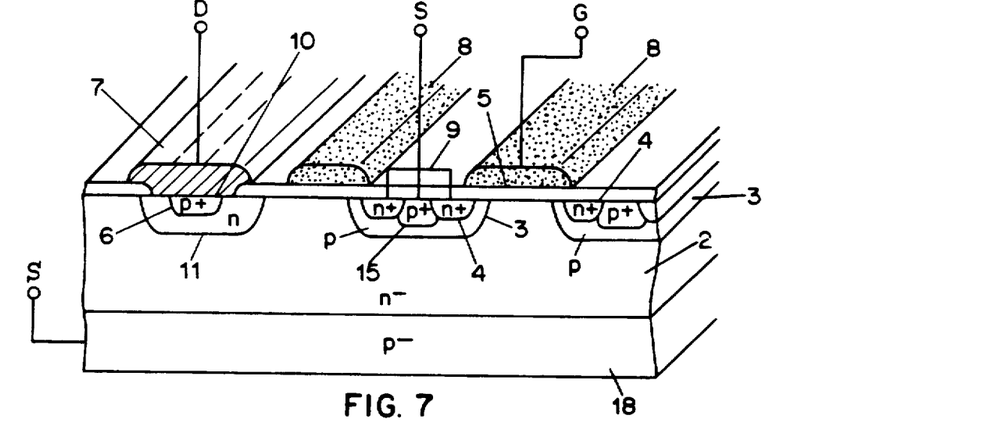
FIG. 7 is a longitudinal sectional drawing illustrating a conductivity modulation MISFET according to a seventh embodiment of the present invention.

The seventh embodiment of the present invention is explained with reference to FIG. 7. In this embodiment, the structure of the conductivity modulation layer (2) on the front surface side and on the surface is identical with that in the third embodiment shown in FIG. 3. However, it is different in that the conductivity modulation layer (2) is formed on a p-type silicon substrate (18). This is the so-called RESURF (Reduced Surface Field) structure, in which, since the silicon substrate (18) is connected to the source S, the p-n junction formed on the contact face of the silicon substate (18) with the conductivity modulation layer (2) is in a reverse bias state when the MOSFET is in an off-state, with the drain voltage being applied, and the depletion layer expands from the p-n junction face to the inside of the conductivity modulation layer (2), while at the same time, forming also within the silicon substrate (18).

At the same time, because a source voltage is applied to the base region (3) through the source contact region (15), depletion layers are formed from the interface of the base region (3) with the conductivity modulation layer (2) into the conductivity modulation layer (2) and the base region (3). When the drain voltage is increased under these conditions the depletion layer in the base region (3) will expand to reach the source region (4), thereby possibly generating a punch-through. However, in this embodiment which adopts a RESURF structure, the depletion layer expanding from the base region (3) partly meets with the depletion layer expanding from the silicon substrate (18) at a high electric field region within the conductivity modulation layer (2) as the drain voltage is raised. As a result, the increase of the space-charge amount in the depletion layers at the subsequent meeting part is depressed. The expansion of the depletion layer in the base region (3) is also depressed, thereby making it more difficult for a punch-through to occur between the conductivity modulation layer (2) and the source region (4) and assuring a high breakdown voltage for the elements.

The n-type embedded layer (1) disposed in the third embodiment is not formed in this embodiment. However, it is possible to assure an on-current value by increasing the conductivity in the conductivity modulation layer (2) when the MOSFET is in an on-state. No drop in the current-carrying capacity, because of the non-existance of the embedded layer (1), has been experimentally verified.

Figure 8:
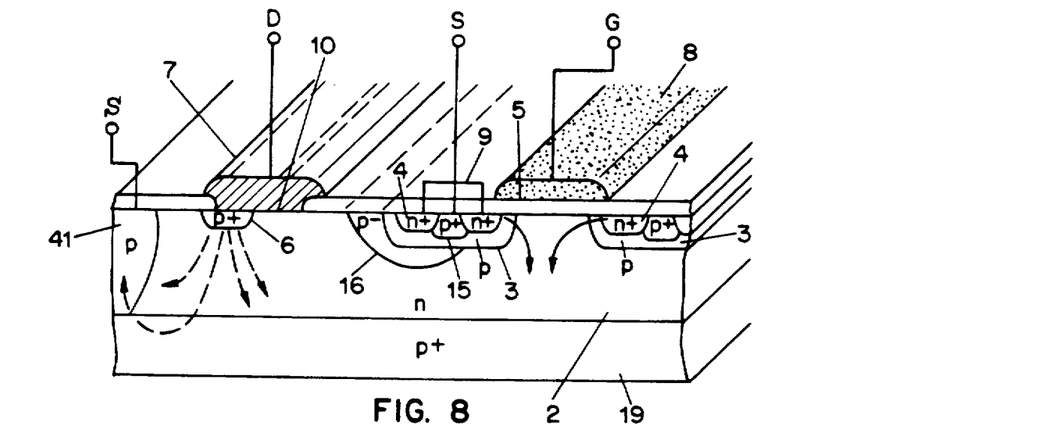
FIG. 8 is a longitudinal sectional drawing illustrating a conductivity modulation MISFET according to an eighth embodiment of the present invention.

The eighth embodiment of the present invention is explained, with reference to FIG. 8. This embodiment has a structure nearly the same as that of the first embodiment shown in FIG. 1, except that a p-type embedded layer (19) is formed beneath the conductivity modulation layer (2) and is connected with an isolation (41), by allowing a potential of the source S to be applied to the embedded layer (19) through the isolation (41).

In this embodiment, which adopts a RESURF structure, as does the seventh embodiment, it is possible to secure a high breakdown voltage in the elements. Furthermore, as the structure allows the positive drawing of the holes of the embedded layer (19) into the conductivity modulation layer (2) in the on-state, and since the embedded layer (19) is kept at a high carrier concentration, it is possible to increase the on-current as well as the current-carrying capacity.

In addition, because the embedded layer (19) is applied with the source voltage through the isolation (41), it is not necessary to separately dispose the structure to apply the source voltage from the rear of the conductivity modulation layer (2), allowing a one-side total electrode structure to be maintained.

As described above, the present invention, which is characterized by having a one-side total electrode structure with a drain electrode disposed on the surface side of a conductivity modulation layer, and by having an electrode junction face with a predetermined area disposed on the drain electrode, conductively contacts the conductivity modulation layer either directly or through a contact region and provides the following effects.

(1) In the case where the electrode junction face conductively contacts directly with the conductivity modulation layer, a parallel resistance is formed as a result of the contact resistance at the electrode junction face with a predetermined area. Therefore, drain short-type elements with adequate parallel resistance can be formed without requiring an additional manufacturing process. The increase in the area occupied by the elements resulting from the transfer of the drain electrode to the surface side can be minimized as a result of its structural simplicity. Moreover, the one-side total electrode structure allows for the formation of an integrated circuit.

(2) If the drain electrode is formed integrally with an externally disposed electrode, it is not necessary to fix wiring between the drain electrode and the externally disposed electrode. This allows for a reduction of the element area, thus preventing a drop in the breakdown voltage of the elements. In particular by using the externally disposed electrode occupying a large area, a parasitic resistance can be formed based on the distance between the electrode junction face and the minority carrier injection region making it a part of the parallel resistance, without having to increase the element area by keeping the electrode junction face and the minority carrier injection region isolated from each other. Furthermore, since it is possible to assure a sufficient diffusion area when diffusing the minority carrier injection region and contact region beneath the drain electrode, it is possible to set the area and depth of these diffusion regions over a wider range, thereby enhancing the element function.

(3) By surrounding the electrode junction face with the minority carrier injection region, it is possible to form a parallel resistance with the above contact resistance added to a pinch resistance. It is also possible to change the parallel resistance by changing the depth of the minority carrier injection region.

(4) If the electrode junction conductivity contacts with the conductivity modulation layer via the contact region, it will be possible to freely set an impurity concentration of the conductivity modulation layer according to the required element characteristics, since it will be possible to reliably prevent a rectifier junction even if the impurity concentration in the conductivity modulation layer is low. Also, by controlling the impurity concentration and the shape of the contact region, it will be possible to optimize the parallel resistance value, thereby enhancing the element function.

(5) If the minority carrier injection region is formed within the contact region, the contact region will function as a depletion layer stopper to prevent a punch-through between the base region and the minority carrier region. Therefore, it will be possible to increase the breakdown voltage of the elements without forming another layer, such as a graft base.

(6) If the contact region is surrounded by the minority carrier injection region, it will be possible to change the parallel resistance value over a wider range, and optimize the parallel resistance value more easily, by changing the ratio of the area over which the minority carrier injection region contacts the drain electrode to the area of the electrode junction face, and by changing the difference of the depths of the minority carrier injection region and the contact region.

(7) If the contact region and the minority carrier injection region are alternately juxtaposed to the MIS part, and the sides of the contact region are located further from the MIS section than from the minority carrier injection region, a narrow band will be formed within the minority carrier injection region on the side of MIS sections in the contact region, thereby forming a pinch resistance. Since the values of this pinch resistance can be controlled easily and precisely according to the surface shape of the diffusion region, it is then possible to form a parallel resistance having an optimum value with high accuracy and good reproducibility.

(8) Because, by adopting the so-called RESURF structure, it is possible to stop the expansion of a depletion layer from the base region using a depletion layer formed from an interface with the second conductive layer; and, to depress an increase of the depletion electric field in the electric field concentration, thus electric field in the base region can be alleviated, thus increasing the breakdown voltage of the elements.

(9) If the carrier concentration in the second conductivity layer is set high in the case of the above RESURF structure, the second conductive layer can be used as a path for the on-current to flow out (or flow in), thereby increasing the current carrying capacity of the elements.

Although specific embodiments of the present invention have been illustrated and explained, it is easy to carry out many changes and variations other than the embodiments described above. For example, it is possible to reverse the conduction type of respective parts or to adopt different production methods for the MISFET provided on the device.

I claim:

1. A semiconductor device including a conductivity modulating MISFET comprising:
   a conductivity modulation semiconductor layer of a first conductive type having a first surface and a second surface;
   a base region of a second conductive type at said first surface of said conductivity modulation layer; a source region of said first conductive type in said base region at said first surface;
   a gate electrode on an insulating layer on said base region;
   a plurality of injection regions of said second conductive type at said first surface of said conductivity modulation layer parallel to said base region;
   a plurality of contact regions located between said injection regions and positioned further away from said base region than said injection regions; and
   a drain electrode physically coupled to said injection regions, said contact regions and said conductivity modulation layer;
   wherein said drain electrode coupled to said conductivity modulation layer via said contact regions provides a resistance parallel to a parasitic diode between said injection regions and said conductivity modulation layer, sufficient to forward bias said parasitic diode.

2. A semiconductor device as described in claim 1, wherein each of said contact regions is a rectangular region and each of said injection region is a rectangular region, said injection regions being larger in size than said contact regions, and further comprising a semiconductor substrate of said first conductive type coupled to said second surface of said conductivity modulation device.

3. A semiconductor device including a conductivity modulating MISFET comprising:
   a conductivity modulation semiconductor layer of a first conductive type having a first surface and a second surface;
   a semiconductor substrate of said first conductive type disposed on said second surface of said conductivity modulation layer;
   a base region of a second conductive type at said first surface of said conductivity modulation layer;
   a source region of said first conductive type in said base region at said first surface;
   a gate electrode on an insulating layer on said base region;
   an injection region of said second conductive type at said first surface of said conductivity modulation layer; and
   a contact region of said first conductive type between said conductivity modulation layer and said injection region, said injection region embedded in the center of said contact region, said drain electrode connected to said contact region and said injection region;
   wherein said drain electrode coupled to said conductivity modulation layer via said contact region provides a resistance, in parallel to a parasitic diode between said injection region and said conductivity modulation layer, sufficient to forward bias said parasitic diode.

4. A semiconductor device including a conductivity modulating MISFET comprising:
   a conductivity modulation semiconductor layer of a first conductive type having a first surface and a second surface;
   a base region of a second conductive type at said first surface of said conductivity modulation layer;
   a source region of said first conductive type in said base region at said first surface;
   a gate electrode on an insulating layer on said base region;
   a first injection region of said second conductive type at said first surface of said conductivity modulation layer;
   a drain electrode electrically coupled to said first injection region and said first surface of said conductivity modulation layer;
   a graft base region, having a lower doping level than said base region, disposed between said base region and said first injection region in said conductivity modulation layer, said graft base region preventing electric filed concentrations between said base region and said first injection region in said conductivity modulation layer;
   a contact region of said first conductive type between said drain electrode and said conductivity modulation semiconductor layer; and
   a second injection region of said second conductive type between said first injection region and said conductivity modulation layer, part of said first injection region being disposed between said contact region and said graft base region, said contact region being laterally surrounded by said first injection region;
   wherein said drain electrode coupled to said conductivity modulation layer via said contact region provides a resistance, in parallel to a parasitic diode between said first injection region and said conductivity modulation layer, sufficient to forward bias said parasitic diode, and said parallel resistance is variable by adjusting the depth of said second injection region.

5. A semiconductor device including a conductivity modulating MISFET comprising:
   a conductivity modulation semiconductor layer of a first conductive type having a first surface and a second surface;
   a semiconductor substrate of a second conductive type disposed on said second surface of said conductivity modulation layer;
   a base region of said second conductive type at said first surface of said conductivity modulation layer;
   a source region of said first conductive type in said base region at said first surface, said semiconductor substrate of said second conductive type conductively coupled to said source region;
   a gate electrode on an insulating layer on said base region;

an injection region of said second conductive type at said first surface of said conductivity modulation layer; and a contact region of said first conductive type between said conductivity modulation layer and said injection region;

said injection region embedded in the center of said contact region, said drain electrode connected to said contact region and said injection region;

wherein said semiconductor substrate of said second conductive type serves to increase the breakdown voltage of said semiconductor device, and said drain electrode coupled to said conductivity modulation layer via said contact region provides a resistance, in parallel to a parasitic diode between said injection region and said conductivity modulation layer, sufficient to forward bias said parasitic diode.

* * * * *